United States Patent
Simpkins

(10) Patent No.: US 10,041,720 B2
(45) Date of Patent: Aug. 7, 2018

(54) COOLING ARRANGEMENT FOR A SUPERCONDUCTING MAGNET STRUCTURE FOR AN MRI SYSTEM

(71) Applicant: SIEMENS HEALTHCARE LIMITED, Camberley (GB)

(72) Inventor: Michael Simpkins, Buckinghamshire (GB)

(73) Assignee: Siemens Healthcare Limited, Camberley (GB)

(*) Notice: Subject to any disclaimer, the term of this patent is extended or adjusted under 35 U.S.C. 154(b) by 0 days.

(21) Appl. No.: 15/504,208

(22) PCT Filed: Jul. 23, 2015

(86) PCT No.: PCT/EP2015/066861
§ 371 (c)(1),
(2) Date: Feb. 15, 2017

(87) PCT Pub. No.: WO2016/023731
PCT Pub. Date: Feb. 18, 2016

(65) Prior Publication Data
US 2017/0299250 A1    Oct. 19, 2017

(30) Foreign Application Priority Data
Aug. 15, 2014 (GB) .................................. 1414516.3

(51) Int. Cl.
| H01F 6/04 | (2006.01) |
| H01F 6/06 | (2006.01) |
| F25D 19/00 | (2006.01) |
| G01R 33/3815 | (2006.01) |

(52) U.S. Cl.
CPC ....... *F25D 19/006* (2013.01); *G01R 33/3815* (2013.01); *H01F 6/04* (2013.01); *H01F 6/06* (2013.01)

(58) Field of Classification Search
CPC ............. F25D 19/006; H01F 6/04; H01F 6/06
See application file for complete search history.

(56) References Cited

U.S. PATENT DOCUMENTS

| 5,045,826 | A | * | 9/1991 | Laskaris | ............ | G01R 33/3815 |
| | | | | | | 174/15.4 |
| 5,668,515 | A | * | 9/1997 | Ariyoshi | ................... | H01F 6/02 |
| | | | | | | 324/318 |
| 7,559,205 | B2 | | 7/2009 | Atkins et al. | | |
| 9,212,782 | B2 | | 12/2015 | Clayton et al. | | |
| 2006/0218942 | A1 | | 10/2006 | Atkins et al. | | |

(Continued)

FOREIGN PATENT DOCUMENTS

| GB | 2 458 265 A | 9/2009 |
| JP | 2014056872 A | 3/2014 |

*Primary Examiner* — Colleen P Dunn
(74) *Attorney, Agent, or Firm* — Schiff Hardin LLP

(57) ABSTRACT

A superconducting magnet structure has a number of axially aligned superconducting inner magnet coils that form an inner magnet structure (30) and a number of superconducting outer coils each having an inner diameter greater than an outer diameter of each of the inner magnet coils. The inner magnet structure is enclosed within a cryogen vessel, and the outer coils are located outside of the cryogen vessel, in thermal contact with a cooling arrangement for cooling the outer coils.

15 Claims, 5 Drawing Sheets

(56) References Cited

U.S. PATENT DOCUMENTS

| | | | |
|---|---|---|---|
| 2010/0102908 A1* | 4/2010 | Wang | G01R 33/288 335/216 |
| 2010/0242502 A1 | 9/2010 | Stautner | |
| 2010/0295640 A1* | 11/2010 | Tamura | G01R 33/3815 335/216 |
| 2014/0047468 A1* | 2/2014 | Nielsen | H04N 21/44008 725/14 |
| 2014/0274721 A1 | 9/2014 | Calvert | |

\* cited by examiner

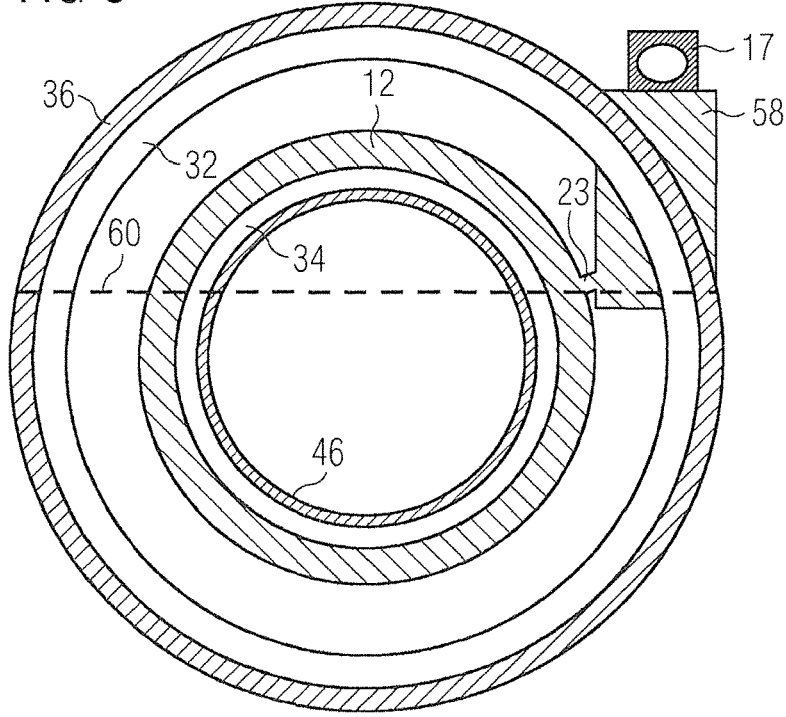
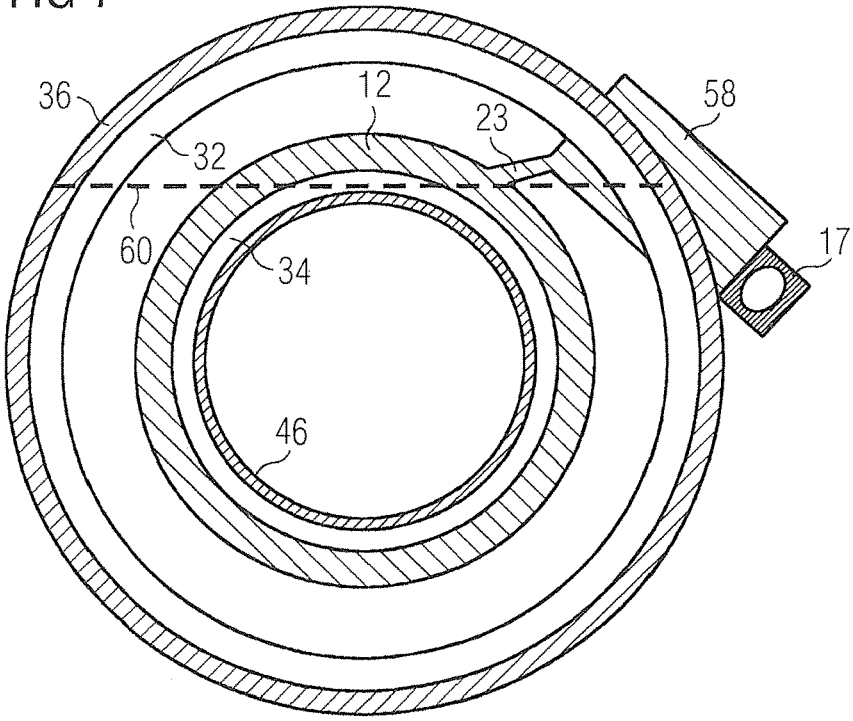

COOLING ARRANGEMENT FOR A SUPERCONDUCTING MAGNET STRUCTURE FOR AN MRI SYSTEM

BACKGROUND OF THE INVENTION

Field of the Invention

The present invention relates to a superconducting magnet structure for a magnetic resonance imaging (MRI) system, and in particular to a cooling arrangement for such a superconducting magnet structure.

Description of the Prior Art

To enable sufficient cooling of superconducting magnet structures used for MRI systems, superconducting coils are typically at least partially immersed in a liquid cryogen at its boiling point.

This requires a cryogen vessel large enough to hold the magnet structure and the liquid cryogen. Known cryogen vessels exceed 2000 liters in volume, with 1700 liters of free space with the magnet structure installed.

As the cryogen vessel must contain cryogen vapor under pressure, it is classified as a pressure vessel, and requires coding approval. The vessel must be manufactured from a relatively small selection of expensive grades of material. It would accordingly be beneficial if the cryogen vessel could be made smaller, as production of the cryogen vessel may be cheaper.

FIG. 1 shows a conventional arrangement of a cryostat including a cryogen vessel 12. A cooled superconducting magnet structure 10 is provided within cryogen vessel 12, itself retained within an outer vacuum chamber (OVC) 14. The illustrated arrangement shows a cylindrical magnet, in which a number of superconducting coils are arranged along an axis. Herein, the term "axial" will be used to denote directions parallel to this axis, or the direction of the axis itself, while the term "radial" will be used to denote directions perpendicular to the axis, extending in a plane which contains the axis. One or more thermal radiation shields 16 are provided in the vacuum space between the cryogen vessel 12 and the outer vacuum chamber 14. In some known arrangements, a cryogenic refrigerator 17 is mounted in a refrigerator sock 15 located in a turret 18 provided for the purpose, towards a side of the cryostat. Access turret 19, which retains access neck (vent tube) 20, is mounted at the top of the cryostat. A larger-bore quench path (not illustrated) is also provided. It is closed by a quench valve or a burst disc, which opens to allow cryogen egress when a pressure within the cryogen vessel exceeds a predefined limit. The refrigerator 17 provides active refrigeration to cool cryogen gas within the cryogen vessel 12, in some arrangements by recondensing it into a liquid. The refrigerator 17 may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K. Re-condensed liquid cryogen drips back into cryogen vessel 12 through pipe 23 which links the refrigerator sock 15 and the cryogen vessel 12.

A negative electrical connection 21a is usually provided to the magnet 10 through the body of the cryostat. A positive electrical connection 21 is usually provided by a conductor passing through the vent tube 20.

A typical design of superconducting magnet structure has superconducting coils of varying diameter. The coils are arranged such that they are all in contact with liquid cryogen to provide efficient cooling during operation. In cryogen vessels described above, a typical cryogen fill requires in the region of 1200 liters of liquid cryogen.

Cryogens such as helium are expensive, and local supply in regions of installation of MRI systems may be unreliable. Helium is a finite resource, and consumption in applications such as cooling of superconducting magnets for MRI equipment means that supplies will become scarcer and more expensive in future. Due to these considerations, at least, it would be desirable to reduce the mass of cryogen required for filling the cryogen vessel of a typical MRI system.

An alternative arrangement for cooling coils of superconducting magnets has been proposed, which involves a series of heat exchangers bonded to the magnet structure, but does not require the provision of an encompassing cryogen vessel.

In such an arrangement, heat is carried from superconducting coils by circulation of cryogen in one or more tube(s) thermally connected to the coils. This arrangement is commonly referred to as a cooling loop. It is relatively complicated to produce and requires a large number of components and pressure retaining joints.

The removal of the encompassing cryogen vessel in such an arrangement leads to other problems, such as gradient coil induced heat loads on the coils, which would conventionally have been intercepted by the cryogen vessel.

SUMMARY OF THE INVENTION

The present invention provides a cooling arrangement for a superconducting magnet structure for an MRI system, which addresses the problems addressed above. It provides a smaller cryogen vessel, a reduced required mass of cryogen, and interception of gradient coil induced heat loads. The complexity of a conventional cooling loop arrangement is avoided.

BRIEF DESCRIPTION OF THE DRAWINGS

FIGS. 6-8 show schematic cross-sections of superconducting magnet structures according to respective embodiments of the present invention.

DESCRIPTION OF THE PREFERRED EMBODIMENTS

In typical superconducting magnet structures for MRI magnets, and the structures addressed by the present invention, an "inner magnet" comprises a number of axially-aligned coils of similar internal diameter. These coils generate most of the magnetic field of the superconducting magnet structure as a whole. The internal diameter of these coils defines the internal diameter of the magnet structure as a whole, and thereby defines the diameter of the patient bore in the completed MRI system.

One or more outer coils of larger diameter are typically also provided. These generally have the task of restraining the stray field outside of the MRI system, and are commonly known as shield coils.

In a typical conventional magnet system, an encompassing cryogen vessel 12 encloses both the shield coils and the inner magnet. This requires a large cryogen vessel, with the attendant disadvantages described above.

Figure 2:
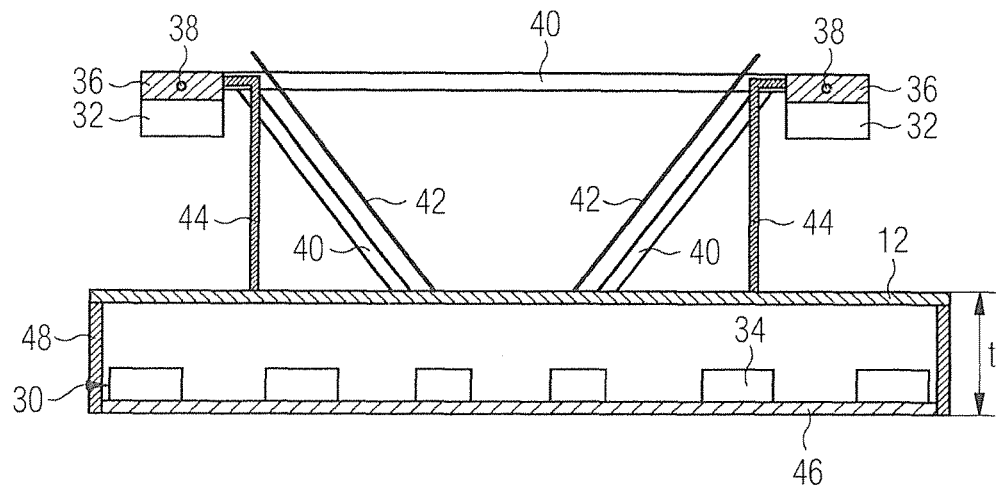
FIGS. 2-5 show schematic axial half-cross-sections of respective superconducting magnet structures according to embodiments of the present invention.

According to the present invention, and as illustrated in FIG. 2, different cooling arrangements are provided for the inner magnet 30 and for the outer coils 32. The inner magnet 30, which consists of a set of coils 34 of similar diameter, is contained within a cryogen vessel 12. Since this cryogen vessel 12 does not need to accommodate the outer (shield) coils, the cryogen vessel 12 may be smaller than is conventional, meaning that it is cheaper to manufacture than a conventional cryogen vessel and requires a smaller mass of cryogen to fill it to a depth sufficient to contact all coils 34 of the inner magnet to provide effective cooling.

The present invention particularly relates to cylindrical magnet structures, and the cryogen vessel preferably comprises a cylindrical enclosure, comprising inner and outer cylindrical walls joined by annular end walls. The annular end walls may have planar surfaces.

According to a feature of the present invention, a different cooling arrangement is provided for the outer (shield) coils 32. This cooling arrangement does not rely on partial immersion of the outer coils 32 in a bath of cryogen. In an embodiment, as illustrated in FIG. 2, the outer (shield) coils are cooled by bonded heat exchangers 36. In the illustrated embodiment, these heat exchangers include a cryogen path 38 being a tube to carry a circulation of liquid or gaseous cryogen to cool the outer coils 32. In the illustrated embodiment, the heat exchangers 36 are also structural members which are held in position by a mechanical support structure 40 which is preferably mounted on the cryogen vessel 12. The cryogen vessel 12 and mechanical support structure 40 thereby hold the outer (shield) coils 32 in place within the OVC.

As the cryogen vessel 12 itself is relatively small, support structures 42 such as composite rods or bands may be longer than conventional, improving the thermal resistance of the support structure between the cryogen vessel 12 and the outer vacuum container 14. In fact, the inventors have found that stainless steel rods may be used as support structures 42 to hold cryogen vessel 12 in place within the OVC 14, in view of the increased length of the rods, and the low thermal conductivity of stainless steel at cryogenic temperatures, such as 4K in the case that a helium cryogen is used.

Circulation of cryogen through the cryogen paths 38 may be provided by connecting their upper and lower extremities to corresponding positions on the cryogen vessel 12, allowing liquid cryogen to enter from, or near, the bottom of the cryogen vessel, and allowing cryogen vapor to leave the cryogen paths 38 and return to the cryogen vessel 12 at, or near, its upper extremity. The cryogen vapor will be cooled in the cryogen vessel by conventional means, such as a recondensing refrigerator 17.

The heat exchanger 36 for the outer coils may be formed by an aluminum extrusion, or a stainless steel structure. The cryogen path 38 may be provided as a feature of an extrusion, for example of aluminum or stainless steel, or may be provided by a separate tube bonded onto a support structure which may be formed by welded pieces of aluminum or stainless steel.

The outer coils 32 may be retained in place by the respective heat exchanger on one or more sides by arrangements conventional in themselves, such as by bolting or bonding. Similarly, the inner magnet 30 may be assembled by any conventional means. In an advantageous embodiment, the coils 34 may be bonded on their radially inner surface to the bore tube 46 of the cryogen vessel, as this will allow the smallest consumption of superconducting wire for a given cryogen vessel bore diameter; or the largest possible cryogen vessel bore tube diameter for a given consumption of superconducting wire. However, other methods of assembly and structures may be used, such as winding coils into recesses in a solid former which is held within the cryogen vessel. The construction of the inner magnet does not form part of the present invention, and any suitable conventional method and arrangement may be used.

Such arrangement as described with reference to FIG. 2 requires only few pressure retaining joints in order to connect the outer coil cooling heat exchanger cryogen paths 38 to the inner magnet cryogen vessel 12.

Due to the smaller volume of the cryogen vessel 12 of the present invention, coding approval is slightly less onerous because the smaller cryogen vessel may be classified in a lower-risk category than conventional cryogen vessels. This may allow less costly coding approval.

The reduced size of the cryogen vessel also allows use of a thinner material thickness for the walls of the cryogen vessel, which lowers system cost and weight. Relatively low-profile ends of the cryogen vessel, meaning that the radial extent t of the cryogen vessel is small compared to its diameter, means that flat end walls 48 may be used, reducing tooling costs and material lead times as compared to more complex end wall solutions which may be employed for conventional cryogen vessels.

The cryogen vessel may be constructed of aluminum or stainless steel, although other materials such as composite materials may be used, as will be apparent to those skilled in the art.

Alternatively, the wall thickness required for a flat end wall 48 may be reduced by some relatively simple forming procedures, such as spinning, or fabrication of conical end walls.

In an embodiment of the present invention, the required volume of liquid cryogen to fill the cryogen vessel 12 may be in the region of 100 liquid liters. Due to the reduced mass of cryogen within the cryogen vessel, the quench pipe (not illustrated) may be made smaller—of a smaller diameter and with thinner walls—than in existing systems which in turn results in a reduced heat load through the service turret due to the quench pipe.

Gradient coil interaction with the inner magnet 30 is similar to the case of a conventional magnet structure in a cryogen vessel. As the inner magnet 30 is contained within a cryogen vessel 12, thermal shielding at 4K is believed unnecessary. Such shielding has been proposed for superconducting magnet structures which are not housed within a cryogen vessel.

Figure 3:
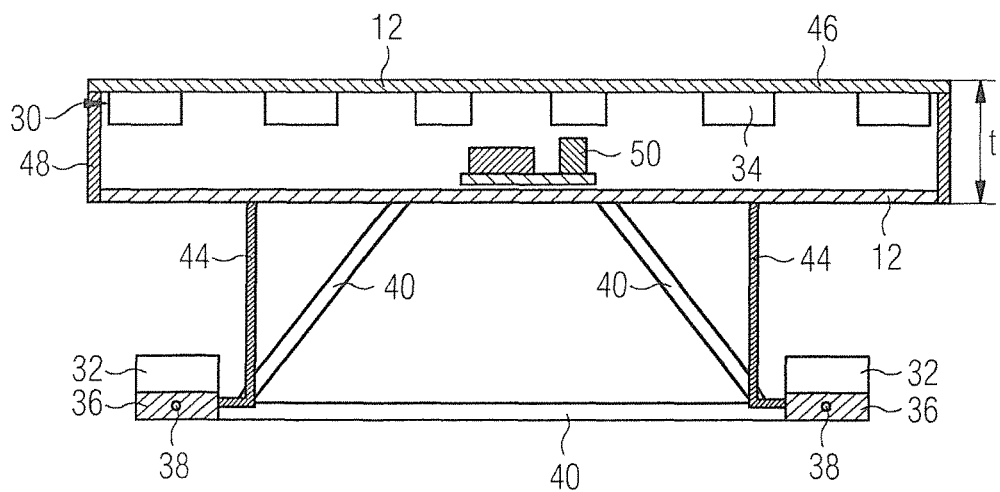

FIG. 3 shows a lower-half-cross section of an embodiment of the invention. As illustrated, electrical termination and connections and switches 50 may all be housed in the inner magnet cryogen vessel 12. They should be located at or near the bottom of the cryogen vessel to ensure that they are immersed in liquid cryogen for optimum cooling, even when the cryogen vessel 12 contains a small quantity of liquid cryogen. This has benefits for lead stabilization, joint cooling & voltage breakdown, since the temperature of the termination, connections and switches is kept at the boiling point of the cryogen in the cryogen vessel.

Figure 4:
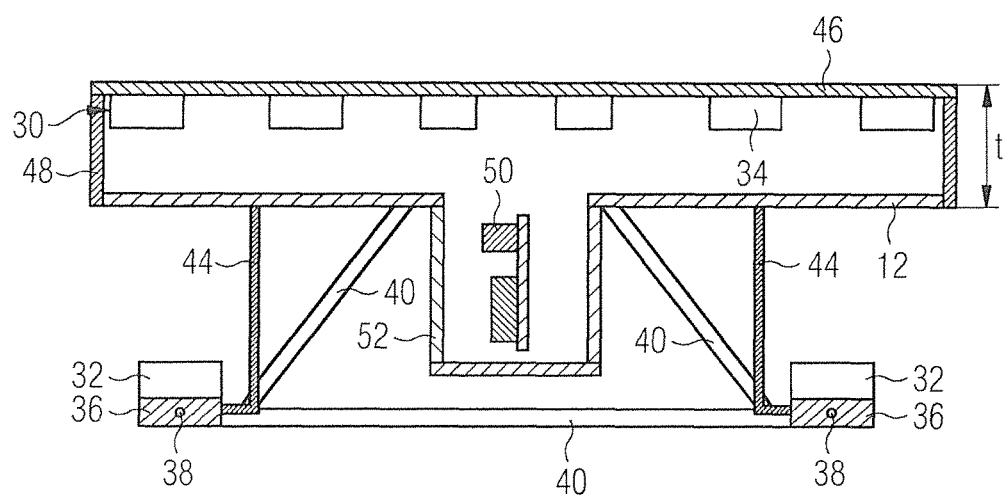

FIG. 4 shows a lower-half-cross section of an embodiment of the invention, representing an improvement on the embodiment of FIG. 3. Rather than simply being located near the bottom of the cryogen vessel 12, a sump 52 is provided at the bottom of the cryogen vessel, and the terminations, connections and switches 50 are located in this sump. This ensures optimum cooling for the terminations, connections and switches even in a relatively small volume of liquid cryogen in cryogen vessel 12. However, provision of such a sump does render the manufacture of the cryogen vessel rather more complicated.

The outer (shield) coils 32 may be electrically connected to the terminations, connections and switches 50 in the cryogen vessel 12. Corresponding leads may be arranged in the vacuum space within the OVC, and may be attached to the pipes 44 which provide communication for cryogen liquid and vapor between the cryogen paths 38 in the heat exchangers 36 and cryogen vessel 12. Such attachment will provide cooling and thermal stabilization of the leads. Electrical connection to the terminations, connections and switches in the cryogen vessel will require superconducting feedthroughs into cryogen vessel 12, as will be familiar to those skilled in the art.

Thermal heat loads from the OVC through the suspension arrangement 42 may be intercepted by the cryogen vessel 12 and the associated cryogenic refrigerator. As illustrated in FIG. 2, this may conveniently be achieved by mechanically suspending 42 the cryogen vessel 12 from the OVC, and mechanically supporting 40 the outer coils 32 and the associated heat exchangers 36 from the cryogen vessel 12.

As the required cryogen vessel 12 is significantly smaller than the encompassing cryogen vessels of the prior art, it may be economically viable to construct the cryogen vessel with an increased pressure tolerance. This may be found useful, for example, for gas buffering during imaging, that is to say that the increased energy dissipation typical in the superconducting magnet during image capture is dissipated by latent heat of evaporation by boiling an increased amount of cryogen, increasing cryogen gas pressure within the cryogen vessel. Once the imaging sequence is over, the cryogenic refrigerator will remove this excess heat from the cryogen vessel, recondensing some of the cryogen vapor back to liquid.

Figure 5:
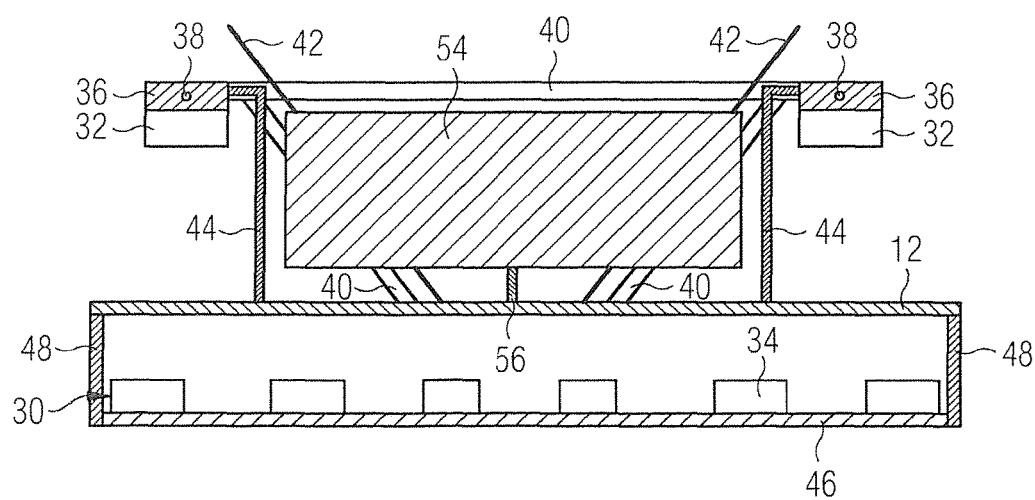

As illustrated in FIG. 5, one or more additional gas buffer tank(s) 54 could be provided, vertically above the inner magnet 30 and in communication with the cryogen vessel 12 through a linking tube 56 to increase this gas buffering effect. Such additional gas buffer tank(s) 54 is/are preferably mounted on the mechanical support structure 40, or may form part of the mechanical support structure.

FIG. 6 illustrates a schematic cross-sectional view of an embodiment of the present invention. A service turret 58 is illustrated, housing a cryogenic refrigerator 17. The cryogenic refrigerator 17 cools a heat exchanger (not shown) which is in communication with the interior of the cryogen vessel 12, for example through a tube 23. Cryogen vapor passes through tube 23 into contact with the heat exchanger, where it is cooled and condenses into a liquid. The resulting liquid cryogen drips back through the tube 23 into the cryogen vessel 12. The level of the tube 23 defines the maximum fill level 60 for the cryogen vessel 12 and the cryogen paths 38 in the heat exchangers 36. When magnets are transported after assembly to their intended installation site, they are typically shipped cold by allowing liquid cryogen in their cryogen vessels to boil. This holds the superconducting magnet at the boiling point of the cryogen, for a cold shipping time which lasts until all of the liquid cryogen has boiled off.

In the present invention, the volume of the cryogen vessel is significantly reduced. This would result in a corresponding reduction in cold shipping time. It is not possible to over-fill the cryogen vessel to extend the shipping time in an embodiment such as shown in FIG. 6 as the maximum cryogen fill level is determined by the level of the tube 23.

However, the reduced size of the cryogen vessel 12 according to the present invention means that a reduced quantity of cryogen is required for filling, and this may mean that it is a practical proposition to ship the magnet structure at ambient temperature, and to perform cool-down at the installation site.

FIG. 7 illustrates a schematic cross-sectional view of another embodiment of the present invention. By using a different type of refrigerator interface, for example a double-recondensing coldhead or a hard-contact coldhead, the access turret 58 and the associated cryogen refrigerator 17 may be inverted. The communication, in this case tube 23, is open to the interior of the cryogen vessel 12 at a location above the refrigerator 17 and may even connect to the cryogen vessel at the very top, meaning that the maximum liquid fill level 60 of liquid cryogen within the cryogen vessel is significantly higher. Significantly more liquid cryogen may be placed in the cryogen vessel for shipping, so extending the cold-ship time.

In such an arrangement, the tube 23 connects to cryogen vessel 12 near its top, but still allows the turret 58 and refrigerator 17 to be located on the side of the magnet structure, meaning that the system's overall height is determined by the height of coils 32. An alternative would be to place turret 58 on the top of the cryogen vessel, which would increase the overall height of the system and restrict the locations into which such system may be installed.

In any of the described embodiments, the inner magnet coils 34 may not be completely immersed in liquid cryogen, and the cryogen tubes 38 cooling the outer (shield) coils 32 will not be filled with liquid cryogen. The upper parts of each coil will then be cooled by cryogen vapor, as is known and conventional in itself. In the cryogen tubes 38 providing cooling to the heat exchangers 36 connected to the outer (shield) coils 32, boiling of liquid cryogen in the tubes 38 will generate a far greater volume of cryogen vapor which will flow up through the cryogen tubes 38 into the cryogen vessel 12, while colder liquid cryogen will enter each cryogen tube 38 at their lower end.

In alternative embodiments of the invention, the outer (shield) coils 32 may be conduction cooled, by a thermal link to the cryogen vessel 12. This may be achieved using a thermal bus bar, laminate or braid.

Figure 8:
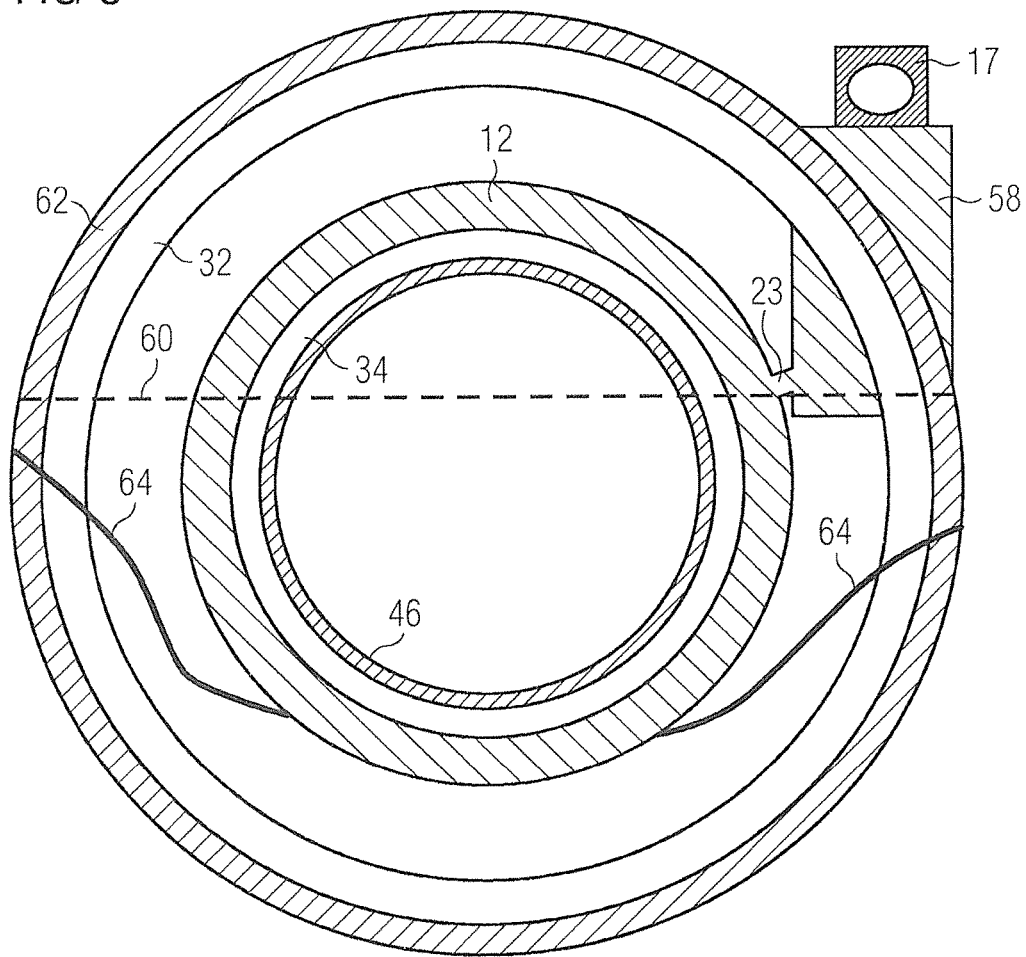

As schematically represented in FIG. 8, outer (shield) coils 32 may be attached to a thermally conductive mechanical support structure 62. This structure is thermally linked to cryogen vessel 12 by a thermally conductive busbar, braid or laminate 64. For most effective cooling, the thermally conductive busbar, braid or laminate 64 may be thermally and mechanically linked to the cryogen vessel 12 below a usual operational level of liquid cryogen.

In other embodiments, it may be found unnecessary to provide a thermally conductive mechanical support structure all around the outer (shield) coils 32. It may be sufficient to mechanically support the outer shield coils in some other way, conventional in itself, and to place thermal links such as one or more thermally conductive busbar, braid or laminate 64 between the outer coil 32 and the cryogen vessel 12.

The thermal conductivity of the material of the outer coil 32 may be sufficient, in such embodiments, to ensure effective cooling of the whole outer (shield) coil 32.

Arrangements such as represented in FIG. 8 have the advantage that cryogen paths 38 do not need to be provided and joined to cryogen vessel 12. By cooling electrical joints on the exterior of the cryogen vessel 12, or on a thermally conductive busbar, braid or laminate 64, the need for current feed-throughs into the cryogen vessel 12 may be reduced or avoided.

The embodiments represented in FIGS. 7 and 8 may be combined in embodiments wherein the outer (shield) coils are conduction cooled, and the communication 23 between the cooled heat exchanger and the cryogen vessel, is open to the interior of the cryogen vessel 12 at a location above the refrigerator 17.

Figure 1:
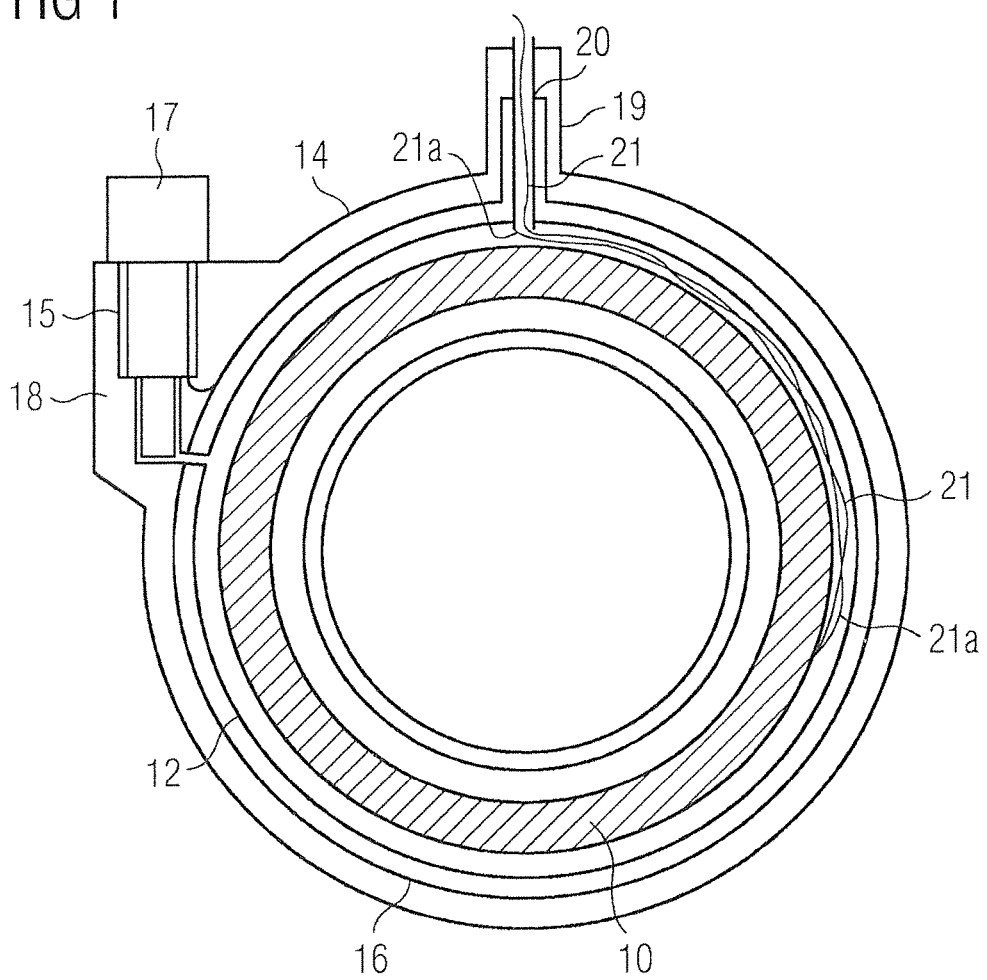
FIG. 1 shows a schematic representation of a conventional superconducting magnet structure suitable for use in an MRI system.

The embodiment represented in FIG. 7 may also be applied to conventional encompassing cryogen vessels such as represented in FIG. 1 to achieve a higher fill level without requiring and increased system height.

The invention claimed is:

1. A superconducting magnet structure comprising:
    a number of axially aligned superconducting inner magnet coils that form an inner magnet structure and a number of superconducting outer coils each having an inner diameter greater than an outer diameter of each of the inner magnet coils;
    a cryogen vessel in which the inner magnet structure is enclosed, with the outer coils located outside of the cryogen vessel
    a cooling arrangement in thermal contact with the outer coils for cooling the outer coils; and
    said cooling arrangement for the outer coils comprising respective heat exchangers in thermal and mechanical contact with respective outer coils, each heat exchanger having a cryogen tube, with upper and lower extremities of each cryogen tube being in communication with the cryogen vessel respectively at or near upper and lower extremities of the cryogen vessel.

2. A superconducting magnet structure according to claim 1, wherein the cryogen tube is extruded.

3. A superconducting magnet structure according to claim 1, wherein the heat exchangers are structural members held in position by a mechanical support structure mounted on the cryogen vessel, and wherein the heat exchangers retain the outer coils (32) in place.

4. A superconducting magnet structure comprising:
    a number of axially aligned superconducting inner magnet coils that form an inner magnet structure and a number of superconducting outer coils each having an inner diameter greater than an outer diameter of each of the inner magnet coils;
    a cryogen vessel in which the inner magnet structure is enclosed, with the outer coils located outside of the cryogen vessel
    a cooling arrangement in thermal contact with the outer coils for cooling the outer coils; and
    the cooling arrangement for the outer coils comprising a thermal link to the cryogen vessel.

5. A superconducting magnet structure according to claim 4 wherein the thermal link comprises a thermal bus bar, laminate or braid.

6. A superconducting magnet structure according to claim 4 comprising a thermally conductive mechanical support structure to which the outer coil as are attached, said support structure being thermally linked to the cryogen vessel by the thermal link.

7. A superconducting magnet structure according to claim 4 wherein the thermal link joins an outer coil to the cryogen vessel.

8. A superconducting magnet structure according to claim 1 comprising an outer vacuum container (OVC) enclosing said cryogen vessel, said outer coils, and said cooling arrangement with said heat exchangers and said cryogen tube.

9. A superconducting magnet structure according to claim 8 comprising support structures that support the cryogen vessel within the OVC support structures comprising rods or bands of stainless steel.

10. A superconducting magnet structure according to claim 1, wherein the cryogen vessel comprises a cylindrical enclosure, comprising inner and outer cylindrical walls joined by annular end walls, the annular end walls being planar surfaces.

11. A superconducting magnet structure according to claim 1, comprising electrical termination and connections and switches housed at or near the bottom of the cryogen vessel.

12. A superconducting magnet structure according to claim 11, comprising a sump at the bottom of the cryogen vessel, with the terminations, connections and switches being located in said sump.

13. A superconducting magnet structure according to claim 11, wherein the outer coils are electrically connected to the terminations, connections and switches in the cryogen vessel.

14. A superconducting magnet structure according to claim 8, wherein the cryogen vessel is mechanically suspended from the OVC, and the outer coils and the associated heat exchangers are mechanically supported from the cryogen vessel.

15. A superconducting magnet structure according to claim 1, further comprising at least one additional gas buffer tank vertically above the inner magnet structure and in communication with the cryogen vessel through at least one linking tube.

* * * * *